United States Patent [19]

Kwon et al.

[11] Patent Number: 5,141,884
[45] Date of Patent: Aug. 25, 1992

[54] ISOLATION METHOD OF SEMICONDUCTOR DEVICE

[75] Inventors: Oh H. Kwon; Dong J. Bae, both of Seoul, Rep. of Korea

[73] Assignee: Samsung Electronics Co., Ltd., Kyungki, Rep. of Korea

[21] Appl. No.: 612,559

[22] Filed: Nov. 13, 1990

[30] Foreign Application Priority Data

Aug. 18, 1990 [KR] Rep. of Korea ............ 90-12905

[51] Int. Cl.$^5$ .......................................... H01L 21/76
[52] U.S. Cl. ........................................ 437/41; 437/63
[58] Field of Search ................ 437/41, 44, 63, 64

[56] References Cited

U.S. PATENT DOCUMENTS 4,818,235  4/1989  Chao .................................. 437/63

FOREIGN PATENT DOCUMENTS 56-79446   6/1981  Japan ................................ 437/44
56-158447 12/1981  Japan ................................ 437/63
62-11273   1/1987  Japan ................................ 437/44

*Primary Examiner*—Olik Chaudhuri
*Assistant Examiner*—G. Fourson
*Attorney, Agent, or Firm*—Ladas & Parry

[57] ABSTRACT

An isolation method of semiconductor devices comprises the steps of forming a multilayer, defining both active and isolating regions, forming a channel stopper, removing the multilayer on a nitride layer to form a capping oxide layer, removing the multilayer on the nitride layer and a polysilicon layer to form an isolation layer, forming spacers at sidewalls of the isolation region, forming a gate oxide layer and a gate oxide electrode, and forming a second conductive diffusion regions, wherein the CVD process and photolithography methods are applied in formation of the isolating layer not to result in the bird's beak and dislocation caused by stress and the channel stopper is formed by ion-implantation of impurity without its diffusion not to contact with the isolating layer by the spacers on the sidewalls thereof in its diffusion region which is formed by the ion-implantation. Therefore, according to the present invention, the limit of the isolation can be extended into a sub-micron range so as to prevent the narrow channel effect and increase the breakdown voltage.

4 Claims, 1 Drawing Sheet

ISOLATION METHOD OF SEMICONDUCTOR DEVICE

BACKGROUND OF THE INVENTION

The present invention relates to an isolation method of semiconductor devices which can minimize an isolating region by preventing the formation of bird's beak.

Recently, as the semiconductor devices have a tendency toward high integration, the isolation region which is to electrically isolate adjacent active regions should be reduced in proportion to the reduction of the chip size. Particularly, the size of the isolation region is a major factor for determining the size of a memory device and thus lots of investigation has been developed to reduce the size of the isolating region.

Generally, a local oxidation of silicon method (LOCOS), trench, field shielding, and so on have been employed for such an isolation method, where the LOCOS method is widely used in such a manner as to form the isolation region by oxidation at high temperature after formation of oxide and nitride layers on the surface of a silicon substrate and subsequential removal of the nitride layer from an isolation region.

However, there is a problem in isolation of narrow active regions due to the bird's beak which extends from the isolation region into the active region during the high temperature oxidation. Furthermore, the stress during oxidation can result in dislocation that causes a subsequent leakage current at P-N junction.

Therefore, the LOCOS method is not suitable for the isolation of submicron devices. As a consequence, the trench and field shielding isolation methods have been proposed for such submicron devices. The trench isolation method can achieve a perfect isolation of the submicron devices. However, there are such problems as deterioration of junction and transistor characteristics. Special equipments and techniques are required to suppress the crystalization defect resulted from the substrate etching during trench formation.

On the other hand, field shielding isolation has a trouble in interconnection since bias should be applied to a field plate. Moreover, the current leakage between the field plate and other electrodes should be eliminated appropriately.

As apparent from the description heretofore, it is very difficult to form the isolation effectively. Various methods proposed to prevent abovementioned problems are not applicable to practical products because of specific techniques and apparatus.

SUMMARY OF THE INVENTION

The present invention has an object to provide an isolation method of semiconductor devices without bird's beak.

The present invention has another object to provide an isolation method of semiconductor devices which forms submicron isolating regions by using traditional techniques without deteriorating the device characteristics.

According to the present invention, there is provided an isolation method of a semiconductor device comprising: forming a multilayer composed of at least a polysilicon layer and a successive nitride layer after growing the oxide layer on a first conductive semiconductor substrate; defining an active region and an isolating region by removing predetermined portions from the multilayer except the polysilicon layer; forming a channel stopper at the isolation region by ion-implantation of the first conductive impurity on the entire surface of substrate; removing the multilayer on the nitride layer and forming a capping oxide layer by oxidizing a predetermined thickness of the polysilicon layer; removing the nitride and polysilicon layers on the isolation region and forming an isolation layer by removing the capping oxide layer and an oxide layer on the active region; forming a spacer at a sidewall of the isolation region by depositing an oxide layer on the entire surface of the structure and anisotropically etching it again; forming a gate oxide layer on the substrate at the active region; forming a gate electrode on the gate oxide layer; and forming each second conductive diffusion region respectively at both sides of the channel region under the gate electrodes.

BRIEF DESCRIPTION OF THE DRAWINGS

These and other objects, features, and advantages of the present invention will become more apparent from the following description for the preferred embodiments taken in conjunction with the accompanying drawings, in which.

DETAILED DESCRIPTION OF THE PREFERRED EMBODIMENT

The present invention will now be described in more detail with reference to the accompanying drawings.

Figure 1A:
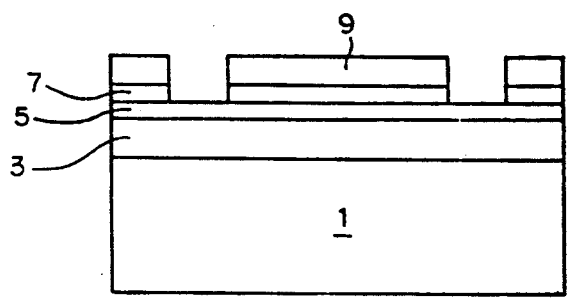
FIG. 1(A)-(D) are schematic cross sectional views illustrating manufacturing steps for explaining an isolation method of semiconductor devices according to the present invention.

FIG. 1(A)~(D) shows an embodiment of the isolation method of semiconductor devices according to the present invention. Subsequently, multilayer is formed on a p-type silicon substrate 1 by the conventional chemical vapor deposition method (CVD), as shown in FIG. 1(A). The multilayer is formed of an oxide layer 3 of 3000~4000 Å, a polysilicon layer 5 of 1000~2000 Å, a nitride layer 7 of 1000~2000 Å and an oxide layer 9 of 3000~4000 Å.

An isolation region is defined by removing a predetermined part from the nitride layer 7 and the oxide layer 9 by the conventional photolithography process. The isolation region can be defined into a submicron range, i.e. down to the limit of the photolithography, where the rest parts unremoved from the nitride layer 7 and the oxide layer 9 become active regions.

Figure 1B:
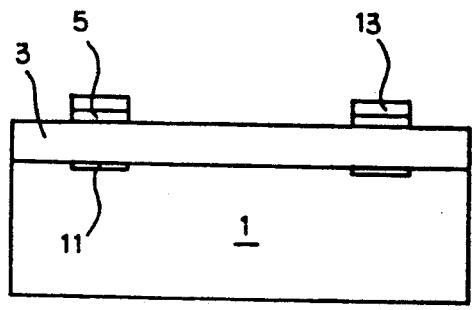

Referring to FIG. 1(B), a channel stopper 11 is formed on the substrate surface by ion-implantation of a p-type impurity with a dose of $1 \times 10^{12} \sim 1 \times 10^{13}$ cm$^{-2}$ at 200 KeV where the oxide layer 9 on the active region serves as an impurity blocking layer. Subsequently, the oxide layer 9 on the active region is removed by wet etching. A capping oxide layer 13 of 500~1000 Å is formed by thermal oxidation of the polysilicon layer 5 on the exposed isolation region, where the nitride layer 7 on the active region serves as an oxidation blocking layer. The polysilicon layer 5 is oxidized as much as a predetermined thickness. In the next step, the nitride layer 7 is removed by wet etching, where the capping oxide layer 13 serves as the etching blocking layer.

Figure 1C:
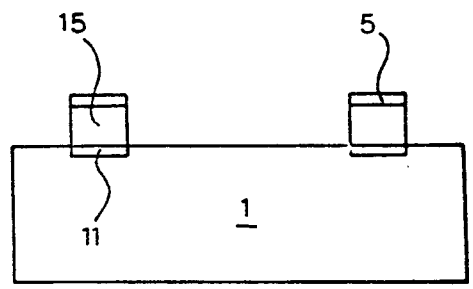

Referring to FIG. 1(C), the oxide layers 3 and 13 on the surface of the structure are removed simultaneously by the RIE method. During the etch of both the oxide layer 3 on the isolation region and the capping oxide layer 13 on the active region, the polysilicon layer 5 forms an isolation oxide layer 15 as a protective layer. This remaining oxide layer is used as an isolation layer 15. In the process described as above, the bird's beak and dislocation which result from thermal growth of local oxide can be eliminated since the isolation layer 15 is not formed by thermal oxidation. Also, the ion-implanted impurity in the channel stopper is suppressed to diffuse into the substrate 1.

Figure 1D:
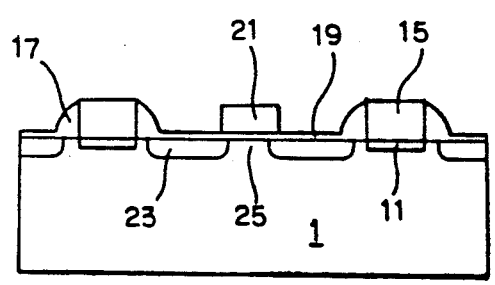

Referring to FIG. 1(D), a spacer 17 is formed at a sidewall of the isolation layer 15 by etching back process after the deposition of an oxide layer on the entire surface of the structure. The polysilicon layer 5 on the isolation layer 15 is removed during the etching back process and the subsequent oxidation process. Subsequently, a gate oxide layer 19 is formed on the exposed surface of the substrate 1 and a gate electrode 21 is formed on a predetermined position on the gate oxide layer 19. A diffusion region 23 is formed by the ion-implantation of a n-type impurity such as phosphorus or arsenic, being used as a source and a drain.

The surface of the substrate 1 under the gate electrode 21 is used as a channel region 25 for connecting the diffusion regions electrically. The diffusion region 23 is not overlapped with the channel stopper 11, thereby increasing the breakdown voltage.

Figure 2:
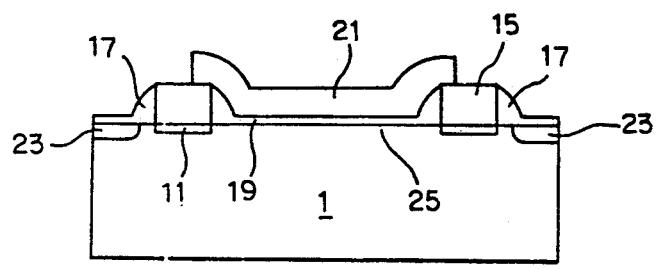
FIG. 2 is a schematic cross sectional view of a gate electrode as shown in FIG. 1(D).

FIG. 2 shows a cross sectional view of the gate electrode 21 as shown in FIG. 1(D). The same reference numbers indicate the same parts as shown in FIG. 1(D). In FIG. 2, narrow channel effect can be prevented in such a manner that the impurity implanted region 11 used as the channel stopper is not diffused into the active region so as to prevent the reduction of the width of the channel region 25 since the isolation layer is not formed by the thermal oxidation. The multilayer is formed of the nitride and oxide layers, but other compositions can be also applied within the true scope of the present invention as long as the nitride and oxide layers are successively included.

As mentioned up to now, the isolation layer is formed only by the CVD and photolithography methods, so that the bird's beak and dislocation due to the stress can be prevented and the impurity of the ion-implantation region used as the channel stopper is not diffused into the active region. Also, the spacer formed at the sidewall of the isolation layer prevents the diffusion region formed by the ion-implantation from touching with the channel stopper. Thus, the present invention has a considerable advantage since the thermal oxidation is not employed in the formation process of the isolation layer.

According to the present invention, the limit of the isolation can be extended into the submicron range by preventing the formation of the bird's beak and the current leakage due to the dislocation caused by the stress can be prevented. Moreover, the narrow channel effect can be effectively prevented since the impurity from the ion-implanted region can not be diffused into the active region. As a result, the breakdown voltage can be increased since the touch between the diffusion and ion-implantation regions is prevented by the spacer.

The invention is in no way limited to the embodiment described hereinabove. Various modifications of disclosed embodiment as well as other embodiments of the invention will become apparent to persons skilled in the art upon reference to the description of the invention. It is therefore contemplated that the appended claims will cover any such modifications or embodiments as fall within the true scope of the invention.

What is claimed is:

1. A method of fabricating a semiconductor device having an isolated region comprising:
    forming a first oxide layer on a semiconductor substrate of a first conductivity type;
    forming a multilayer comprising a polysilicon layer which covers said first oxide layer, and a nitride layer covering said polysilicon layer;
    removing a portion of said nitride layer to expose a portion of said polysilicon layer, said exposed portion overlying an isolation region of said substrate, and a covered portion of said polysilicon layer overlying an active region of said substrate;
    forming a channel stopper in said isolation region by implanting ions therein through said exposed portion of said polysilicon layer;
    oxidizing said exposed polysilicon layer to provide a capping oxide layer overlying said isolation region;
    removing said multilayer from over said active region of said substrate and forming a patterned isolation layer comprising said first oxide layer by removing the capping oxide layer and that portion of said first oxide layer covering said active region;
    forming a spacer at a side wall of said isolation layer by depositing a second oxide layer on the entire surface of the structure and selectively etching said second oxide layer;
    forming a gate oxide layer on said substrate over said active region thereof;
    forming a gate electrode on said gate oxide layer; and
    forming second conductivity type regions within said substrate underlying said gate electrode.

2. A method according to claim 1 wherein said multilayer includes a third oxide layer overlying said nitride layer and including the steps of removing a portion of said third oxide layer for exposing said portion of said polysilicon layer, and removing the remainder of said third oxide layer prior to providing said capping oxide layer.

3. The method according to claim 1 comprising oxidizing a thickness of said exposed polysilicon layer less than the entire thickness thereof to leave a remaining portion of said polysilicon layer overlying said isolation region.

4. The method according to claim 3 comprising removing that portion of said first oxide layer covering said active region using a reactive ion etching process that does not remove said remaining portion of said polysilicon layer overlying said isolation region.

* * * * *